(12) United States Patent
Hsu et al.

(10) Patent No.: US 12,002,655 B2
(45) Date of Patent: Jun. 4, 2024

(54) PLASMA PROCESSING APPARATUS

(71) Applicant: Hitachi High-Tech Corporation, Tokyo (JP)

(72) Inventors: Chen Pin Hsu, Tokyo (JP); Hitoshi Tamura, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 136 days.

(21) Appl. No.: 17/433,327

(22) PCT Filed: Apr. 30, 2020

(86) PCT No.: PCT/JP2020/018261
§ 371 (c)(1),
(2) Date: Aug. 24, 2021

(87) PCT Pub. No.: WO2021/220459
PCT Pub. Date: Nov. 4, 2021

(65) Prior Publication Data
US 2022/0344132 A1    Oct. 27, 2022

(51) Int. Cl.
*H01J 37/32* (2006.01)
(52) U.S. Cl.
CPC .. *H01J 37/32229* (2013.01); *H01J 37/32266* (2013.01); *H01J 37/32678* (2013.01)
(58) Field of Classification Search
CPC ......... H01J 37/32192–32311; H01J 37/32201; H01J 37/32211; H01J 37/3222;
(Continued)

(56) References Cited

U.S. PATENT DOCUMENTS 5,134,965 A * 8/1992 Tokuda ............. H01J 37/32192
                                                        204/298.31
5,433,789 A * 7/1995 Kakehi ................. C23C 16/511
                                                        118/723 MR
(Continued)

FOREIGN PATENT DOCUMENTS

JP    H03019332 A    1/1991
JP    H0677147 A     3/1994
(Continued)

OTHER PUBLICATIONS

Search Report dated Aug. 11, 2020 in International Application No. PCT/JP2020/018261.
(Continued)

*Primary Examiner* — Kurt Sweely
(74) *Attorney, Agent, or Firm* — Miles & Stockbridge, P.C.

(57) ABSTRACT

In order to enable plasma density distribution control having a high degree of freedom to solve problems of not only in-plane uniformity of an etching processing but also a reduction of a charge-up damage, a plasma processing apparatus includes: a vacuum chamber provided with a plasma processing chamber that plasma-processes a substrate inside and is able to exhaust the inside of this plasma processing chamber to a vacuum; and a microwave power supply unit that is provided with a microwave source and a circular waveguide and supplies, via the circular waveguide, a microwave power oscillated from the microwave source to the vacuum chamber, in which the microwave power supply unit is configured by arranging a plurality of waveguides, which are coaxially and concentrically arranged with the circular waveguide and have different dielectric constants inside, between the circular waveguide and the vacuum chamber.

8 Claims, 5 Drawing Sheets

(58) Field of Classification Search
CPC ........... H01J 37/32229; H01J 37/32238; H01J 37/32247; H01J 37/32256; H01J 37/32266; H01J 37/32275; H01J 37/32284; H01J 37/32293; H01J 37/32302; H01J 37/32678
See application file for complete search history.

(56) References Cited

U.S. PATENT DOCUMENTS

| | | | |
|---|---|---|---|
| 5,714,009 A * | 2/1998 | Boling | H01J 37/32211 118/723 ME |
| 6,034,346 A * | 3/2000 | Yoshioka | H01J 37/32229 204/298.37 |
| 6,172,321 B1 | 1/2001 | Yoshioka et al. | |
| 6,347,602 B2 | 2/2002 | Goto et al. | |
| 8,955,456 B2 * | 2/2015 | Cullen | H01J 37/32238 427/575 |
| 2007/0113978 A1 * | 5/2007 | Ishii | H01L 21/67069 118/723 MW |
| 2012/0024819 A1 | 2/2012 | Suemitsu | |
| 2012/0186747 A1 * | 7/2012 | Obama | H01J 37/32284 156/345.42 |
| 2014/0308461 A1 | 10/2014 | Cullen et al. | |
| 2018/0226230 A1 * | 8/2018 | Kobayashi | H01J 37/32229 |

FOREIGN PATENT DOCUMENTS

| | | |
|---|---|---|
| JP | H0757894 A | 3/1995 |
| JP | H07057892 A | 3/1995 |
| JP | H07135093 A | 5/1995 |
| JP | 2012033385 A | 2/2012 |
| JP | 2014089976 A | 5/2014 |
| JP | 2020507187 A | 3/2020 |
| KR | 10-2013-0102637 A | 9/2013 |
| TW | 339497 B | 1/1998 |
| WO | 2018144613 A2 | 8/2018 |

OTHER PUBLICATIONS

Nathan Marcuvitz "Waveguide handbook" New York, McGraw-Hill, 1951, 1st Edition, pp. 70-71.
Office Action dated May 23, 2022 in Taiwanese Application No. 110106614.
Office Action dated Oct. 14, 2023 in Korean Application No. 10-2021-7016705.

* cited by examiner

[FIG. 1]
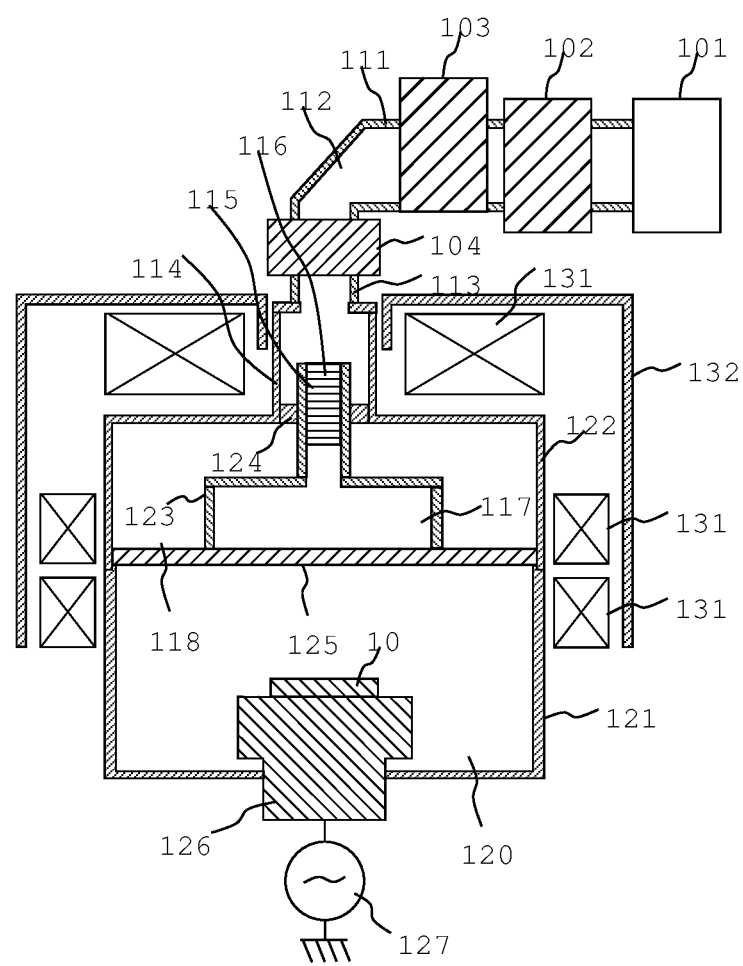

[FIG. 2]
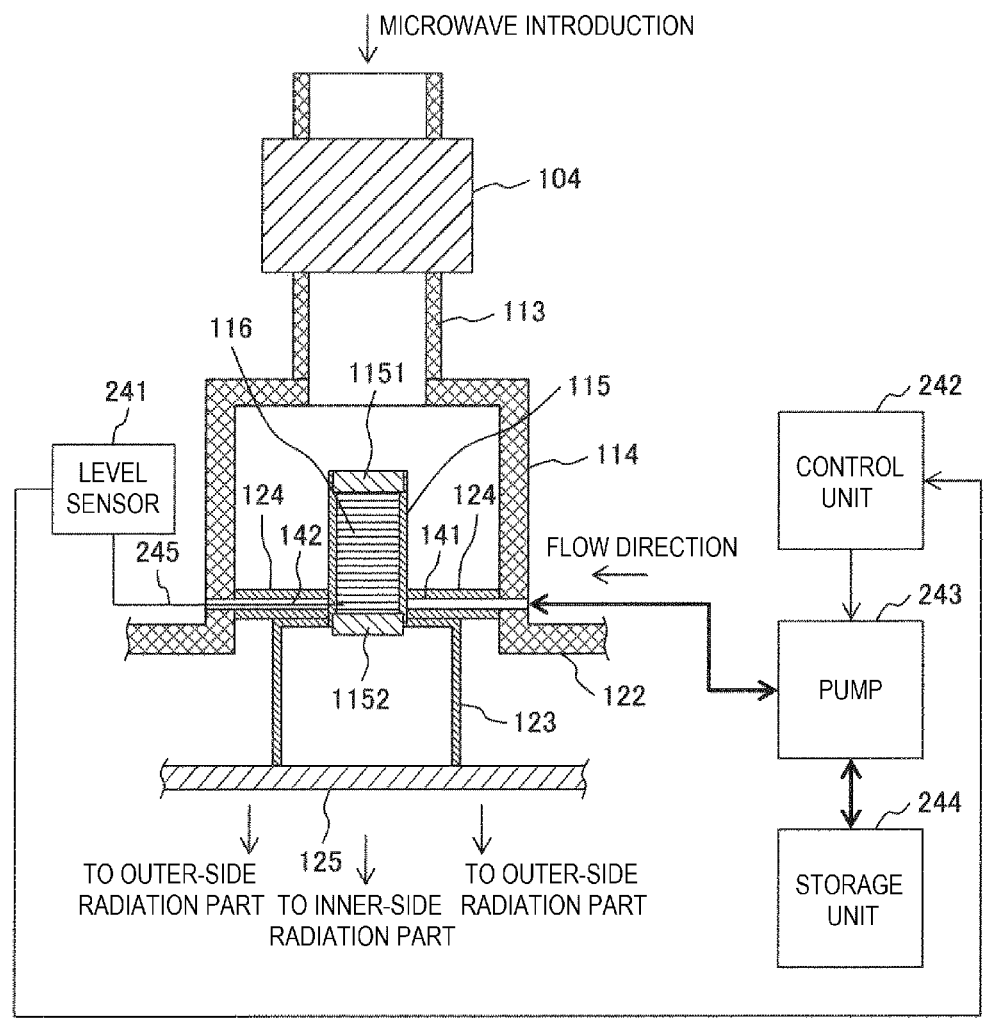

[FIG. 3]
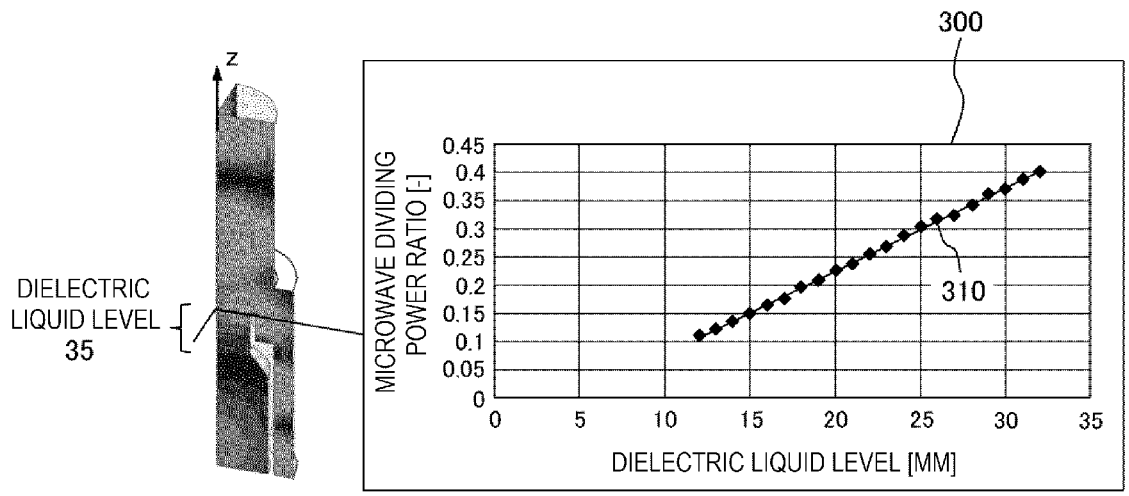
[FIG. 4]
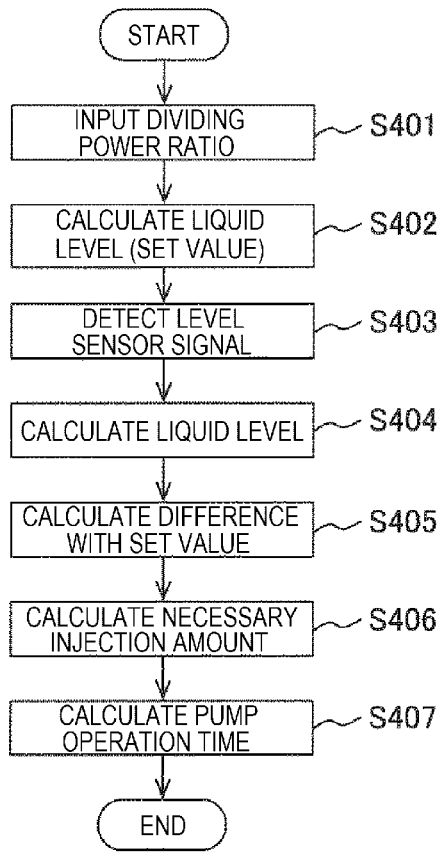

[FIG. 5]
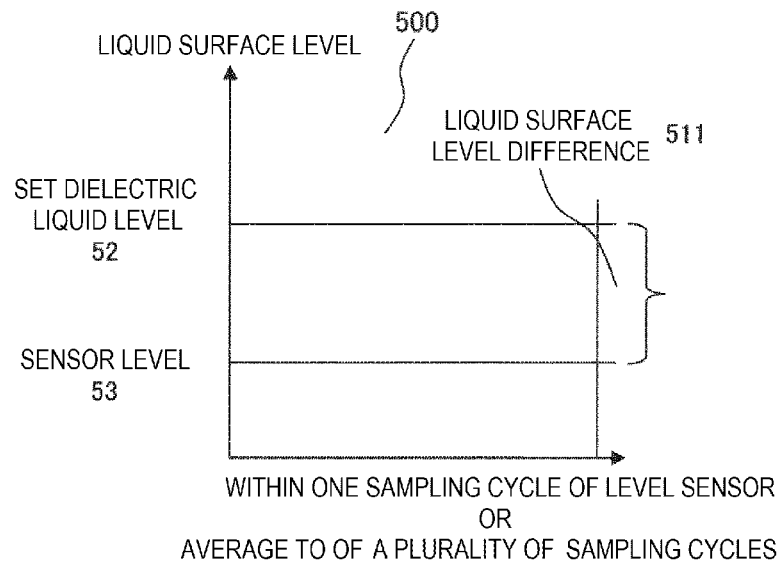
[FIG. 6]
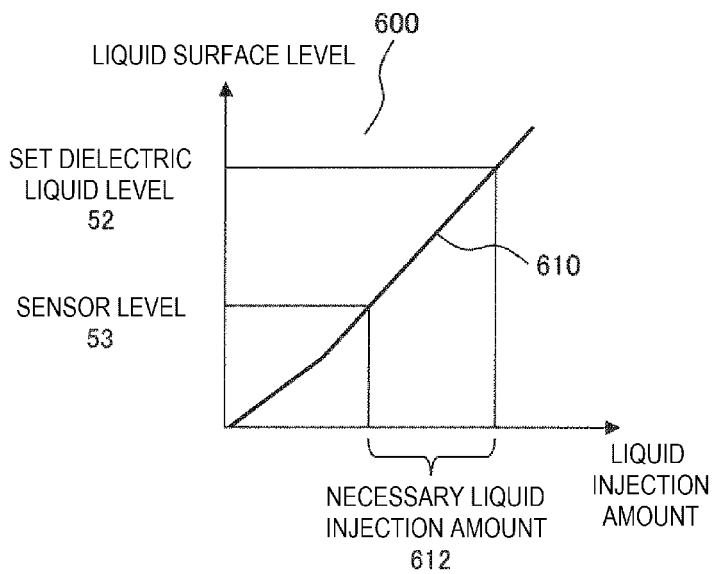

[FIG. 7]
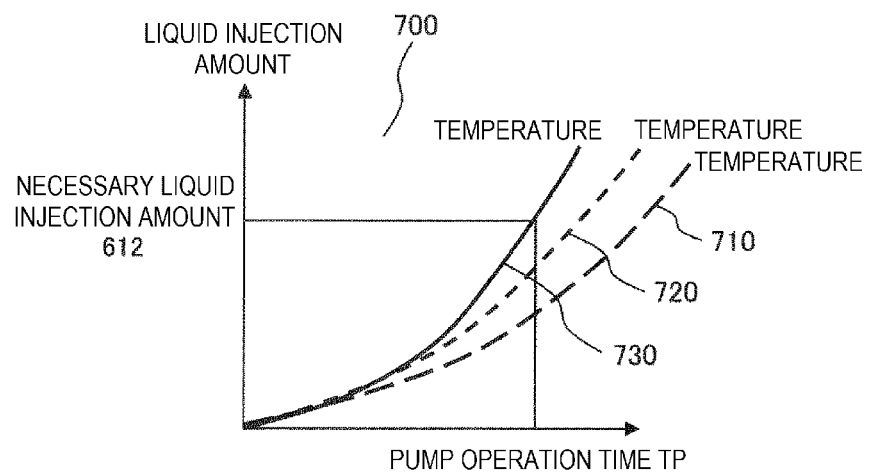

PLASMA PROCESSING APPARATUS

TECHNICAL FIELD

The present invention relates to a plasma processing apparatus using microwaves.

BACKGROUND ART

Due to a high degree of integration of a semiconductor element, development of an etching processing technique with a high aspect ratio is promoted. One of miniaturization etching techniques in a semiconductor field is a dry etching technique, and among the techniques, plasma enhanced etching is often used.

The plasma excites molecules or atoms of a processing gas by utilizing a collision of electrons with the molecules or the atoms of the processing gas, and generates ions and radicals. A plasma processing apparatus realizes isotropic etching by the ions and isotropic etching by the radicals. As a plasma source, electron cyclotron resonance (ECR) is known.

As a configuration of an ECR etching apparatus in the related art, PTL 1 describes a configuration in which a microwave of 2.45 GHz emitted from a magnetron is propagated through a rectangular waveguide and a circular waveguide, and introduced into a processing chamber in which a magnetic field is formed through a quartz window in an upper portion of the processing chamber, by an electric field generated by the microwaves and a magnetic field formed in a direction perpendicular to the electric field, the electron cyclotron resonance is generated, high-density plasma is generated, and a substrate is processed by ions and radicals from plasma.

PTL 2 describes a microwave discharge generating device in which a dielectric is filled between an inner wall of a cavity resonator and a discharge tube, when changing gas conditions or the substrate, the dielectric is replaced with a dielectric having a different relative permittivity such that a resonance frequency of the cavity resonator matches a microwave oscillation frequency caused by the magnetron, and when using a liquid dielectric, the dielectric is introduced from the outside of the cavity resonator, flows between the inner wall of the cavity resonator and the discharge tube, and is discharged to the outside of the cavity resonator.

CITATION LIST

Patent Literature

PTL 1: JP-A-H06-77147
PTL 2: JP-A-H07-57894

Non-Patent Literature

Non-PTL 1: WAVEGUIDE HANDBOOK N. MARCUVITZ

SUMMARY OF INVENTION

Technical Problem

It is generally known that a plasma density on a wall surface of the processing chamber of the plasma processing apparatus is lower than a plasma density on a center portion of the processing chamber due to a loss caused by a reaction on a solid surface, which is the wall surface. Due to such non-uniformity of a plasma density distribution, an etching rate for a substrate to be processed is non-uniform.

In PTL 1, in order to prevent the non-uniformity of the plasma density distribution of the processing chamber, a configuration is adopted in which a microwave power introduced into the processing chamber is divided by using an inner-side waveguide and an outer-side waveguide. With such a configuration, the plasma density on the wall surface of the processing chamber can be increased.

However, in the configuration disclosed in PTL 1, since a single microwave source is used, a microwave power ratio between a center and a wall side of the processing chamber is fixed depending on an arrangement number of waveguides. On the other hand, when performing a plasma processing, depending on processing conditions, hardware of the processing apparatus may be changed, and it is necessary to adjust the microwave power ratio respectively. However, in the configuration disclosed in PTL1, it is difficult to flexibly adjust the power ratio.

In a process of manufacturing a semiconductor element, the etching rate for the substrate to be processed is not necessarily dependent on the plasma density. Therefore, when a processing condition, such as a heat distribution, is prioritized, in order to obtain uniformity of the processing, in-plane uniformity of etching the substrate to be processed may be finally obtained if the distribution of plasma density can be adjusted dynamically during one processing cycle.

In addition, when a thin film of the semiconductor element is to be etched, a thin film distribution on the substrate to be processed often forms a non-uniform film thickness due to characteristics such as exhaust conductance of a film forming apparatus and symmetry of the processing chamber. For example, when a distribution of the film thickness of the thin film to be etched is a convex distribution in which the film thickness in the center is high and the film thickness in the surrounding is low, it is required to control an input power of the microwave on the center of the substrate to be processed to be larger than an input power of the surrounding portion of the substrate to be processed. Contrarily, when the film thickness has a concave distribution in which the film thickness in the center is low and the film thickness in the surrounding is high, it is necessary to make the input power of the microwaves on the center of the processing substrate smaller than the input power of the surrounding portion of the processing substrate.

As described above, since there are various factors in order to realize the in-plane uniformity of the etching processing, plasma density distribution control with high degree of freedom is required for the etching apparatus using plasma.

On the other hand, in order to realize the isotropic etching using ion incidence, a configuration is adopted in which a bias power is applied to a substrate electrode by using an RF power supply. When an RF bias power is applied to the substrate electrode in a state where the plasma is generated in the processing chamber, charges may accumulate on a surface of a substrate placed on the substrate electrode, and a charge-up damage may occur in the semiconductor element formed on the substrate. Reducing the occurrence of the charge-up damage can greatly contribute to improving a yield of the semiconductor element.

Therefore, there is a demand for a plasma etching apparatus having plasma density distribution control with a high degree of freedom in order to solve problems of not only the in-plane uniformity of the etching processing but also the reduction of the charge-up damage.

On the other hand, the microwave discharge generating device disclosed in PTL 2 has a configuration in which the dielectric is filled between the inner wall of the cavity resonator and the discharge tube, but no consideration is given to controlling the distribution of the plasma density inside the discharge tube on which the substrate is placed.

The invention is to solve the above problems and to provide a plasma processing apparatus with capable of performing plasma density distribution control having a high degree of freedom in order to solve problems of not only in-plane uniformity of an etching processing but also a reduction of a charge-up damage.

Solution to Problem

In order to solve the above problems, the invention provides a plasma processing apparatus, including: a processing chamber in which a sample is plasma-processed; a radio frequency power supply configured to supply, via a waveguide, a radio frequency power of a microwave for generating plasma; and a magnetic field forming mechanism configured to form a magnetic field inside the processing chamber, in which the waveguide includes a first circular waveguide filled with a liquid dielectric, and a second circular waveguide arranged on an outer side of the first circular waveguide and arranged coaxially with the first circular waveguide.

In order to solve the above problems, the invention provides a microwave power control system configured to control a microwave power of a plasma processing apparatus. The plasma processing apparatus includes: a processing chamber in which a sample is plasma-processed; a radio frequency power supply configured to supply, via a waveguide, a radio frequency power of a microwave for generating plasma; and a magnetic field forming mechanism configured to form a magnetic field inside the processing chamber. The waveguide includes a first circular waveguide filled with a liquid dielectric, and a second circular waveguide arranged on an outer side of the first circular waveguide and arranged coaxially with the first circular waveguide. The microwave power control system is configured to control a ratio of a microwave power propagating through the first circular waveguide to a microwave power propagating through the second circular waveguide by controlling a liquid level of the dielectric.

Advantageous Effect

According to the invention, a plasma density in the plasma processing apparatus can be controlled in accordance with a desired etching rate, and problems of not only in-plane uniformity of a plasma processing but also a reduction of a charge-up damage can be solved with a relatively high degree of freedom.

BRIEF DESCRIPTION OF DRAWINGS

FIG. 1 is a vertical cross-sectional view showing a schematic configuration of a main part of a plasma processing apparatus according to an embodiment of the invention.

FIG. 2 is a vertical cross-sectional view showing a configuration of a waveguide for adjusting a microwave power in the plasma processing apparatus according to the embodiment of the invention.

FIG. 3 is a graph showing results obtained by simulation of a relationship between a dielectric liquid level and a microwave dividing power ratio in the plasma processing apparatus according to the embodiment of the invention.

FIG. 4 is a flow chart showing a flow of processing for calculating a pump operation time for adjusting a liquid level according to the embodiment of the invention.

FIG. 5 is a graph showing a relationship between a liquid surface level and one sampling cycle of a level sensor or an average value of a plurality of sampling cycles according to the embodiment of the invention.

FIG. 6 is a graph showing a relationship between the liquid surface level and an injection amount of a liquid dielectric into an inner-side waveguide according to the embodiment of the invention.

FIG. 7 is a graph showing a relationship between the injection amount of the liquid dielectric into the inner-side waveguide and the pump operation time according to the embodiment of the invention.

DESCRIPTION OF EMBODIMENTS

The invention relates to a plasma processing apparatus (ECR plasma etching apparatus) configured to be capable of controlling a distribution of a microwave radiation power into a plasma processing chamber with respect to an inner-side waveguide filled with a liquid dielectric and an outer-side waveguide having a hollow inside, which are arranged coaxially, particularly a relative permittivity and a filling amount of the liquid dielectric filled in the inner-side waveguide.

Further, the invention relates to a plasma processing apparatus configured to divide a microwave power from a single microwave source to enter the inner-side waveguide and the outer-side waveguide arranged coaxially, adjust a microwave dividing power ratio between the inner-side waveguide and the outer-side waveguide by increasing or decreasing the microwave power passing through the inner-side waveguide according to the filling amount of the liquid dielectric inside the inner-side waveguide, and control a plasma density in a plasma processing chamber according to a desired etching rate.

In the ECR plasma etching apparatus, the microwave power from a rectangular waveguide coupled to a magnetron is branched into the inner-side waveguide and the outer-side waveguide arranged coaxially, and ends of the inner-side waveguide and the outer-side waveguide are coupled to an inner-side radiation unit and an outer-side radiation unit arranged on an upper surface of each processing chamber, whereby the micro power can be radiated from each radiation unit into the inside of the plasma processing chamber.

Here, when a propagation of the microwave power in the inner-side waveguide is limited, if a radius a of the inner-side waveguide is designed by equation (Math. 1), the microwave power can be passed or blocked.

[Math. 1]

$$a = \frac{1.841C}{2\pi f_c}[m] \quad (1)$$

Here, fc is a microwave frequency of 2.45 GHz, and C is a speed of light in free space of $2.99 \times 10^8$ m/s.

For example, in the propagation of the microwave power in a TE11 mode, when a medium is air or vacuum, a value of a relative permittivity εr is 1, and thus, the radius of the inner-side waveguide is 0.0357 m according to the equation (Math. 1). When the value of the relative permittivity εr of the medium in the inner-side waveguide is 2, a propagation speed of the microwave power is reduced to 1/√εr, and thus, the radius of the inner-side waveguide is 0.0252 m according to the equation (Math. 1).

When the radius a of the inner-side waveguide is designed to be smaller than 0.0357 m and larger than 0.0252 m, the microwave power of 2.45 GHz is blocked when the medium is vacuum or air, so that the microwave power cannot pass through the waveguide having a certain length. That is, it can be seen that the microwave power is not radiated from the inner-side radiation unit coupled to the inner-side waveguide, and the plasma density in the vicinity of the center portion of the plasma processing chamber is decreased.

On the other hand, when the medium having a value of relative permittivity εr of 2 is inserted into the above inner-side waveguide having the radius a, the micro power can pass through the inner-side waveguide. That is, the micro power is radiated from the inner-side radiation unit coupled to the inner-side waveguide, and the plasma density in the vicinity of the center portion of the plasma processing chamber is increased. Therefore, a dividing power ratio of the microwave to be introduced into the processing chamber can be freely controlled according to conditions of an etching processing of a semiconductor element.

For example, when a liquid dielectric is used as the above medium having a value of relative permittivity εr of 2, the liquid dielectric can be freely operated for a liquid level thereof because of being a liquid, and the microwave power passing through the inner-side waveguide can be adjusted. Therefore, the dividing power ratio of the microwave power of the inner-side waveguide to the outer-side waveguide can be adjusted within a certain range depending on the liquid level of the liquid dielectric. A definition of the dividing power ratio of the microwave is expressed by the following equation (Math. 2).

[Math. 2]

$$\text{DIVIDING POWER RATIO } \emptyset = \frac{|S_{21}|^2}{|S_{21}|^2 + |S_{31}|^2} \qquad (2)$$

Here, $S_{21}$ is a transmission S parameter of the inner-side waveguide, and $S_{31}$ is a transmission S parameter of the outer-side waveguide.

Since the outer-side waveguide is coaxial with the inner-side waveguide, the microwave is propagated along a coaxial waveguide. The coaxial waveguide has no blocking in a TEM mode, which is a basic mode, and an outer-side waveguide diameter b during the blocking in the TE11 mode, which is a higher-order mode thereof, can be determined by using the following equation (Math. 3).

[Math. 3]

$$k_c \cong \frac{2}{a+b} \qquad (3)$$

Here, a: radius [m] of inner-side waveguide
b: radius [m] of outer-side waveguide Considering the equation (Math. 2), the outer-side waveguide is set to a dimension that does not block.

The invention is based on the concept described above, and a specific embodiment thereof will be described with reference to the drawings.

Hereinafter, an embodiment of the invention will be described in detail with reference to the drawings. In all the drawings for illustrating the present embodiment, components having the same function are denoted by the same reference numerals, and a repeated description thereof is omitted in principle.

However, the invention is not construed as being limited to the description of the embodiment shown below. It is easily understood by those skilled in the art that a specific configuration thereof can be changed without departing from the idea or gist of the invention.

Embodiment

FIG. 1 shows a schematic configuration of a plasma processing apparatus (ECR plasma etching apparatus) 100 according to an embodiment of the invention.

In the configuration shown in FIG. 1, 101 denotes a microwave power oscillator, 102 denotes an isolator, 103 denotes an automatic matching unit, 111 denotes a rectangular waveguide, 112 denotes a circular/rectangular transformer, 104 denotes a circularly polarized wave generator, 113 denotes a circular waveguide, 114 denotes an outer-side waveguide, 115 denotes an inner-side waveguide, 116 denotes a liquid dielectric stored inside the inner-side waveguide 115, 117 denotes an inner-side cavity, and 118 denotes an outer-side cavity.

In addition, 120 denotes a plasma processing chamber, 121 denotes a vacuum chamber, 122 denotes a vacuum chamber upper portion, 123 denotes an inner-side cavity wall, 124 denotes a ring stay, 125 denotes a quartz window, 126 denotes a lower electrode, 127 denotes an RF power supply, 131 denotes an electromagnet coil, 132 denotes a yoke, and 10 denotes a substrate to be processed.

In the configuration shown in FIG. 1, an exhaust unit that exhausts the inside of the vacuum chamber 121, that is, the plasma processing chamber 120 to the vacuum, a gas supply unit that supplies a processing gas to the inside of the vacuum chamber 121, that is, the plasma processing chamber 120, and a control unit that controls the microwave power oscillator 101, the automatic matching unit 103, the electromagnetic coil 131, the RF power supply 127, or the like are omitted.

In the configuration described above, a microwave power of 2.45 GHz output from the microwave oscillator 101 is propagated to the circular/rectangular transformer 112 by the rectangular waveguide 111 via the isolator 102 and the automatic matching unit 103. The magnetron is used as the microwave oscillator 101. The circular/rectangular transformer 112 also serves as a corner that bends a traveling direction of the microwave power by 90 degrees, thereby reducing a size of the entire apparatus.

The circularly polarized wave generator 104 is coupled to a lower portion of the circular/rectangular transformer 112, and the microwave power incident on a linearly polarized wave is converted into a circularly polarized wave. Further, the circular waveguide 113 provided on a substantially central axis of the vacuum chamber 121 constituting the plasma processing chamber 120 is located on a side of the circularly polarized wave generator 104 close to the plasma processing chamber 120, and a circularly polarized microwave power is propagated.

In the present embodiment, the microwave power propagated from the circular waveguide 113 is incident on the outer-side waveguide 114 mounted on the vacuum chamber upper portion 122 and the inner-side waveguide 115 arranged on an inner side of the outer waveguide 114.

Here, the radius of the inner-side waveguide 115 is formed in a dimension smaller than 0.0357 m, which is the radius for blocking the microwave power when the inside of the inner-side waveguide 115 is air, and larger than 0.0252 m, which is the radius for blocking the microwave power when the inner-side waveguide 115 is filled with the liquid dielectric having a relative permittivity εr of 2, which is described using the equation (1).

Thus, when the inside of the inner-side waveguide 115 is filled with air without storing the liquid dielectric 116, the inner-side waveguide 115 blocks the microwave power. In this case, the microwave power propagated from the circular waveguide 113 is incident only on the outer-side waveguide 114.

On the other hand, when the liquid dielectric 116 is stored inside the inner-side waveguide 115 and is filled with the liquid dielectric 116, since the inner-side waveguide 115 propagates the microwave power, the microwave power propagated from the circular waveguide 113 is incident on the outer-side waveguide 114 and the inner-side waveguide 115.

The outer-side waveguide 114 is coupled to the outer-side cavity 118 inside the vacuum chamber upper portion 122, and the inner-side waveguide 115 is coupled to the inner-side cavity 117 partitioned by the inner-side cavity wall 123 inside the vacuum chamber upper portion 122. The outer-side cavity 118 and the inner-side cavity 117 are partitioned from the plasma processing chamber 120 inside the vacuum chamber 121 by the quartz window 125.

In order to perform an ECR plasma etching processing, an outer periphery of the vacuum chamber 121 and the vacuum chamber upper portion 122 is covered with the electromagnetic coil 131 for forming a magnetic field inside the vacuum chamber 121 and the vacuum chamber upper portion 122. The lower electrode 126, on which the substrate 10 to be processed is placed, is located on a central bottom surface of the plasma processing chamber 120.

The RF power supply 127 for applying an RF bias power is coupled to the lower electrode 126. By applying the RF bias power from the RF power supply 127 to the lower electrode 126, ions of the processing gas ionized in the plasma are accelerated toward the substrate 10 to be processed placed on the lower electrode 126, and a thin film on the substrate 10 to be processed is removed.

The microwave power output from the oscillator 101 and propagated through the isolator 102, the automatic matching unit 103, the circular/rectangular transformer 112, the circularly polarized wave generator 104, and the circular waveguide 113 is divided to enter the inner-side waveguide 115 and the outer-side waveguide 114.

When the inside of the inner-side waveguide 115 is not filled with the liquid dielectric 116, the inner-side waveguide 115 is filled with air. In this state, as described above, since the dielectric constant of air is 1 and the radius of the inner-side waveguide is formed in the dimension for blocking the microwave, the microwave power cannot pass through the inner-side waveguide 115.

On the other hand, when the inner-side waveguide 115 is filled with the liquid dielectric 116, the microwave begins to leak from the inner-side waveguide 115, and when the liquid dielectric 116 is gradually poured, the level of the liquid surface (liquid level) of the liquid dielectric 116 in the inner-side waveguide 115 increases, and an amount of the microwave power passing therethrough also increases. By adjusting the liquid level of the liquid dielectric 116 in the inner-side waveguide 115, a ratio of the microwave power propagated from the circular waveguide 113 to the inner-side waveguide 115 and the microwave power propagated from the circular waveguide 113 to the outer-side waveguide 114 can be changed.

FIG. 2 shows a detailed configuration of the inner-side waveguide 115 and the outer-side waveguide 114. The inner-side waveguide 115 has a configuration in which the inside is hollow, a top cover 1151 and a bottom plate 1152 each made of a dielectric are provided, and the inside is hermetically sealed.

The ring stay 124 made of quartz is provided between the inner-side waveguide 115 and the outer-side waveguide 114, and the inner-side waveguide 115 and the outer-side waveguide 114 are coaxially fixed by the ring stay 124. Further, in order to be able to supply or discharge the liquid dielectric 116 from the outside to the inside of the inner-side waveguide 115, a flow path 141 is formed from the outer-side waveguide 114 to the inner-side waveguide 115 through the ring stay 124.

The flow path 141 is coupled to a pump 243 for supplying or discharging the liquid dielectric 116 to or from the inside of the inner-side waveguide 115. The pump 243 is controlled by a control unit 242 and supplies the liquid dielectric 116 stored in a storage unit 244 to the inside of the inner-side waveguide 115 through the flow path 141. Conversely, the liquid dielectric 116 inside the inner-side waveguide 115 is discharged to a storage unit 244 side through the flow path 141.

In order to monitor a height of the liquid surface of the liquid dielectric 116 inside the inner-side waveguide 115, a communication pipe 142 communicating with the inside of the inner-side waveguide 115 from the outer-side waveguide 114 through the ring stay 124 is provided. The communication pipe 142 is coupled to a level sensor 241 via a pipe 245.

Next, a series of operations of a liquid surface control system for filling/discharging the liquid dielectric 116 into/from the inside of the inner-side waveguide 115 will be described. The liquid surface level of the liquid dielectric 116 inside the inner-side waveguide 115 is measured using the level sensor 241 via the pipe 245 coupled to the communication pipe 142, and the liquid surface level is fed as an electronic signal back to the control unit 242.

When the inside of the inside waveguide 115 is filled with the liquid dielectric 116, the liquid dielectric 116 is sucked up by using the pump 243 from the storage unit 244 for storing the liquid dielectric 116, and the inside of the inner-side waveguide 115 is filled with the liquid dielectric 116. When the pump 243 is rotated in a reverse direction, the liquid dielectric 116 in the inner-side waveguide 115 is sucked out and returned to the storage unit 244 for storing the liquid dielectric 116.

The control unit 242 includes a program for adjusting the liquid surface level of the liquid dielectric 116 inside the inner-side waveguide 115 based on a liquid surface detection signal from the level sensor 241 such that the ratio (microwave dividing power ratio) of the microwave power propagated from the circular waveguide 113 to the inner-side waveguide 115 to the microwave power propagated from the circular waveguide 113 to the outer-side waveguide 114 is a preset value. By this program, an operation time of the pump 243 is controlled so as to achieve a desired microwave dividing power ratio.

FIG. 3 shows results of obtaining a relationship between the dividing power ratio and the dielectric liquid level by electromagnetic field simulation. Ina graph 300 shown in FIG. 3, a vertical axis represents a microwave power dividing ratio, and a horizontal axis represents the level of the liquid surface of the dielectric liquid as the dielectric liquid level.

From this graph, it can be seen that the liquid dielectric liquid level and the dividing power ratio have a substantially linear relationship as indicated by a straight line 310. Accordingly, when a program obtained by polynomializing this linear relationship is implemented in the control unit 242, a set value of the liquid level of the liquid dielectric required to obtain the desired microwave dividing power ratio can be converted from the desired microwave dividing power ratio.

Next, with reference to FIGS. 5 to 7, a processing flow of determining the operation time of the pump 243 based on the desired microwave dividing power ratio of the inner-side waveguide 115 to the outer-side waveguide 114 is described using FIG. 4.

First, the desired microwave dividing power ratio is input (S401). Next, the value of the level (liquid level) of the liquid surface of the liquid dielectric corresponding to the input desired microwave dividing power ratio is obtained from the graph shown in FIG. 3, and this value is set as the set value (S402).

Next, the level (liquid level) of the liquid surface of the liquid dielectric 116 inside the inner-side waveguide 115 is detected by the level sensor 241 (S403), and the liquid level of the liquid dielectric 116 corresponding to a detection signal of the level sensor 241 is obtained based on a relationship between the detection signal of the level sensor 241 and the level of the liquid surface of the liquid dielectric 116 inside the inner-side waveguide 115, which are obtained in advance (S404).

Next, as shown in a graph 500 in FIG. 5, a difference (liquid surface level difference 511) between the value of the liquid level (sensor level 53) of the liquid dielectric 116 inside the obtained inner-side waveguide 115 and the set value (set dielectric liquid level 52) obtained in S402 is calculated (S405).

Next, a necessary injection amount 612 of the liquid dielectric 116 injected into the inside of the inner-side waveguide 115 is calculated based on a relationship 610, as shown in a graph 600 in FIG. 6, between a liquid injection amount of the liquid dielectric 116 supplied via the pump 243 to the inner-side waveguide 115 and the liquid surface level of the liquid dielectric 116 inside the inner-side waveguide 115 detected by the level sensor 241, which is obtained in advance (S406).

Finally, a pump operation time is calculated based on relationships 710 to 730, as shown in a graph 700 in FIG. 7, between the pump operation time (PT) of the pump 243 and the liquid injection amount to the inner-side waveguide 115 using a temperature of the liquid dielectric 116 obtained in advance as a parameter (S407).

Based on the pump operation time thus obtained, the control unit 242 controls the pump 243 to supply the liquid dielectric 116 to the inside of the inner-side waveguide 115. Accordingly, the microwave power oscillated from the oscillator 101 and propagated through the circular waveguide 113 is divided and propagated into the inner-side waveguide 115 and the outer-side waveguide 114 according to the desired microwave dividing power ratio.

When the level of the liquid surface of the liquid dielectric 116 inside the inner-side waveguide 115 is controlled based on the processing flow as described above, the desired microwave power dividing ratio can be adjusted even when a volume of the liquid dielectric 116 changes depending on the temperature.

Next, a procedure for processing the substrate 10 to be processed in the present embodiment will be described.

First, the control unit 242 controls the pump 243 such that the pump operation time obtained by the procedure described above is obtained, and the liquid dielectric 116 is supplied to the inner-side waveguide 115. Next, in this state, the plasma processing chamber 120 is exhausted to vacuum via an exhaust unit (not shown), the processing gas is supplied to the plasma processing chamber 120 from a gas supply unit (not shown), and the plasma processing chamber 120 is set to a predetermined pressure.

In this state, the oscillator 101 is driven to transmit the microwave power. The microwave power transmitted from the oscillator 101 propagates through the isolator 102, the automatic matching unit 103, the circular/rectangular transformer 112, the circularly polarized wave generator 104, and the circular waveguide 113, and is divided and input into the inner-side waveguide 115 and the outer-side waveguide 114.

Here, in the inner-side waveguide 115 and the outer-side waveguide 114, the level of the liquid surface of the liquid dielectric 116 inside the inner waveguide 115 is adjusted to obtain the desired microwave power dividing ratio. Therefore, the microwave power divided at a desired dividing ratio is propagated from the inner-side waveguide 115 to the inner-side cavity 117 and from the outer-side waveguide 114 to the outer-side cavity 118.

The microwave power divided and propagated inside the inner-side waveguide 115 in this manner is propagated from the inner-side cavity 117 coupled to the inner-side waveguide 115 to the vicinity of the center portion of the plasma processing chamber 120 through the quartz window 125. On the other hand, the microwave power divided and propagated inside the outer-side waveguide 114 is propagated from the outer-side cavity 118 coupled to the outer-side waveguide 114 to the vicinity of a peripheral portion (portion separated from the center portion) of the plasma processing chamber 120 through the quartz window 125.

In the plasma processing chamber 120, plasma having a density corresponding to the microwave power propagated from the inner-side cavity 117 is generated in the vicinity of the center portion of the plasma processing chamber 120, and plasma having a density corresponding to the microwave power propagated from the outer-side cavity 118 is generated in a portion separated from the center portion of the plasma processing chamber 120, so that plasma having a desired density distribution is generated in the entire plasma processing chamber 120.

By generating the plasma having the desired plasma density distribution in the plasma processing chamber 120 in this manner, in a case of etching the substrate 10 to be processed placed on the lower electrode 126, the etching processing can be performed while not only achieving in-plane uniformity of the etching processing, but also reducing a charge-up damage.

According to the present embodiment, by adopting a configuration in which the microwave power dividing ratio propagating through the inner-side waveguide 115 and the outer-side waveguide 114 can be adjusted, even when the configuration of the etching apparatus is changed in accordance with the processing conditions, or even when the film thickness distribution of the thin film formed on the substrate to be processed is non-uniform, the plasma density in the plasma processing apparatus can be controlled in accordance with the desired etching rate, so that it is possible to perform the etching process in which the charge-up damage is reduced while maintaining the in-plane uniformity of the etching processing.

When the present embodiment is applied to a plasma etching apparatus including a substrate to be processed having a size of 12 inches, at present, it is desirable that the relative permittivity εr of the liquid dielectric is around 2 because of the pipe size of the waveguide of the microwave power. Examples thereof include silicone oil, Fluorinert (trademark) manufactured by 3M, and Galden (trademark) manufactured by Solvay. Further, since the pipe size of the waveguide is also changed in accordance with an increase in the size of the processing apparatus due to a large substrate to be processed, the value of the relative permittivity εr of the liquid dielectric is not particularly limited as long as the function of the invention in which the microwave is blocked or passed is fulfilled depending on the presence or absence of the liquid dielectric.

Further, although it is desirable that the shape of the top cover 1151 and the bottom plate 1152 of the inner-side waveguide 115 in the present embodiment is a disc shape or a conical shape, any shape may be used as long as the liquid dielectric 116 is confined inside the inner-side waveguide 115 and a reflected power of the microwave can be reduced. The dielectric such as quartz or ceramics may be used for the top cover 1151 and the bottom plate 1152 such that the microwave can be transmitted therethrough. It is desirable that the ring stay 124 for coupling the inner-side waveguide 115 and the outer-side waveguide 114 is made of a dielectric such as quartz or ceramics in order to reduce reflection of the microwave power.

Although the invention made by the present inventor has been specifically described above based on the embodiment, it is needless to say that the invention is not limited to the above embodiment, and various modifications can be made without departing from the gist of the invention. For example, the embodiment described above is described in detail for easy understanding of the invention, and is not necessarily limited to those having all the configurations described above.

REFERENCE SIGN LIST

10 substrate to be processed
101 oscillator
102 isolator
103 automatic matching unit
104 circularly polarized wave generator
113 circular waveguide
114 outer-side waveguide
115 inner-side waveguide
116 liquid dielectric
117 inner-side cavity
118 outer-side cavity
120 plasma processing chamber
121 vacuum chamber
122 vacuum chamber upper portion
123 inner-side cavity wall
124 ring stay
125 quartz window
126 lower electrode
127 RF power supply
131 electromagnetic coil
132 yoke
241 level sensor
242 control unit
243 pump
244 storage unit
1151 top cover
1152 bottom plate

The invention claimed is:

1. A plasma processing apparatus, comprising:
a processing chamber in which a sample is plasma-processed;
a radio frequency power supply configured to supply, via a waveguide, a radio frequency power of a microwave for generating plasma;
a magnetic field forming mechanism configured to form a magnetic field inside the processing chamber, wherein
the waveguide includes a first circular waveguide having a hollow inside portion filled with a liquid dielectric, and a second circular waveguide arranged on an outer side of the first circular waveguide and arranged coaxially with the first circular waveguide; and
a control device configured to control a liquid level of the dielectric such that a ratio of a microwave power propagating through the first circular waveguide to a microwave power propagating through the second circular waveguide is a desired ratio.

2. The plasma processing apparatus according to claim 1, wherein
the waveguide further includes a circular waveguide arranged above the first circular waveguide, and
an inner diameter of the circular waveguide is smaller than an inner diameter of the second circular waveguide.

3. The plasma processing apparatus according to claim 1, wherein
a radius of the first circular waveguide is formed to be larger than a radius for blocking the microwave power when the first circular waveguide is filled with the dielectric having a relative permittivity of 2, and smaller than a radius for blocking the microwave power when the inside of the first circular waveguide is air.

4. The plasma processing apparatus according to claim 1, wherein
the control device is further configured to raise the liquid level when the ratio of the microwave power propagating through the first circular waveguide to the microwave power propagating through the second circular waveguide is increased.

5. The plasma processing apparatus according to claim 1, wherein
the control device is further configured to control the liquid level based on a correlation between the liquid level and the ratio of the microwave power propagating through the first circular waveguide to the microwave power propagating through the second circular waveguide, and
the correlation is substantially linear.

6. The plasma processing apparatus according to claim 2, wherein
a frequency of the microwave is 2.45 GHz, and
a radius of the first circular waveguide is formed to be larger than a radius for blocking the microwave power when the first circular waveguide is filled with the dielectric having a relative permittivity of 2, and smaller than a radius for blocking the microwave power when the inside of the first circular waveguide is air.

7. The plasma processing apparatus according to claim 3, wherein
a frequency of the microwave is 2.45 GHz,
the waveguide further includes a circular waveguide arranged above the first circular waveguide, and
an inner diameter of the circular waveguide is smaller than an inner diameter of the second circular waveguide.

8. A microwave power control system, which controls a microwave power of a plasma processing apparatus, comprising:
- a processing chamber in which a sample is plasma-processed,
- a radio frequency power supply configured to supply a radio frequency power of a microwave for generating plasma,
- a magnetic field forming mechanism configured to form a magnetic field inside the processing chamber,
- a waveguide arranged to supply the radio frequency power of the microwave and including a first circular waveguide having a hollow inside portion filled with a liquid dielectric,
- a second circular waveguide arranged on an outer side of the first circular waveguide and arranged coaxially with the first circular waveguide; and
- a controller configured to control a liquid level of the liquid dielectric according to a ratio of a microwave power propagating through the first circular waveguide to a microwave power propagating through the second circular waveguide.

\* \* \* \* \*